United States Patent
Oka

(10) Patent No.: US 6,806,741 B2
(45) Date of Patent: Oct. 19, 2004

(54) PHASE COMPARATOR CAPABLE OF PERFORMING STABLE PHASE COMPARISON FOR HIGH FREQUENCY BAND

(75) Inventor: Toshihide Oka, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/627,605

(22) Filed: Jul. 28, 2003

(65) Prior Publication Data

US 2004/0183570 A1 Sep. 23, 2004

(30) Foreign Application Priority Data

Mar. 19, 2003 (JP) .................................... 2003-076077

(51) Int. Cl.[7] .............................................. H03D 9/00
(52) U.S. Cl. ............................................. 327/2; 327/9
(58) Field of Search ....................................... 327/2–12

(56) References Cited

U.S. PATENT DOCUMENTS

| | | | | |
|---|---|---|---|---|
| 5,457,718 A | * | 10/1995 | Anderson et al. | ............ 375/373 |
| 5,687,203 A | * | 11/1997 | Baba | .......................... 375/376 |
| 5,754,080 A | | 5/1998 | Chen et al. | |
| 6,118,316 A | * | 9/2000 | Tamamura et al. | .......... 327/156 |

FOREIGN PATENT DOCUMENTS

| | | | | |
|---|---|---|---|---|
| JP | 2000-36729 | | 2/2000 | |
| JP | 2002111458 A | * | 4/2002 | ............ H03K/5/26 |
| JP | 2002-246901 | | 8/2002 | |

OTHER PUBLICATIONS

Savoj, et al. "High–Speed CMOS Circuits for Optical Receievers" Kluwer Academic Publishers (2001) pp. 42–53, 120–121.

* cited by examiner

*Primary Examiner*—Timothy P. Callahan
*Assistant Examiner*—Cassandra Cox
(74) *Attorney, Agent, or Firm*—McDermott Will & Emery LLP

(57) ABSTRACT

A phase comparator includes a phase comparison unit performing a phase comparison. The phase comparison unit carries out a switching operation according to the exclusive OR between two signals to be compared and passes or receives a current to or from an output node according to a resultant phase difference. The exclusive OR is associated with the switching operation of two transistors. Namely, when one of the two transistors is turned on, the result of the exclusive OR is L level. Accordingly, the charging/discharging time for an output signal of a logic circuit is shortened and a stable phase comparison can be performed.

7 Claims, 9 Drawing Sheets

PHASE COMPARATOR CAPABLE OF PERFORMING STABLE PHASE COMPARISON FOR HIGH FREQUENCY BAND

BACKGROUND OF THE INVENTION

1. Field of the Invention

The present invention relates to a phase comparator performing a phase comparison between two input signals within a signal processing circuit.

2. Description of the Background Art

In general, a PLL (phase-locked loop) circuit is in wide use for stabilizing the oscillation frequency, for example, of an oscillator.

The PLL circuit monitors such a reference signal as a system clock and establishes synchronization with another clock or the like. Specifically, a phase difference between a reference signal which is input to a phase comparator in the PLL circuit and an internal feedback signal is measured to adjust the oscillation frequency of a voltage-controlled oscillator (hereinafter referred to as VCO) which generates a timing signal according to the measured phase difference. The generated signal is input as a feedback signal to the phase comparator and the phase comparator makes a phase comparison again between the reference signal and the feedback signal.

The PLL circuit thus monitors the reference signal and continuously performs the above-described loop operation to adjust the oscillation frequency of the VCO circuit thereby synchronize respective phases of the reference signal and the feedback signal.

One of various types of phase comparators is, for example, a digital phase comparison circuit which performs a phase comparison based on the exclusive OR. Japanese Patent Laying-Open No. 2000-36729 discloses a configuration of a phase comparator performing a phase comparison based on time-average amounts of currents flown respectively into and out of the circuit according to the exclusive OR between two input signals.

Specifically, there are provided a logic circuit performing a switching operation based on the exclusive OR between two-input-signals and a current control circuit controlling the amounts of currents flown into and out of the circuit according to the result of the phase comparison.

If a phase comparison is made between signals in the high-frequency band, the logic circuit is required to perform signal processing at a higher frequency than that of input signals, i.e., to perform a high-speed switching operation.

The logic circuit, however, needs a predetermined period of time for passing electric charges for charging/discharging in the switching operation. Therefore, if an extremely high speed operation is required, the switching operation could not follow the change in phase. In other words, the amount of current controlled by the current control circuit could not follow the change in phase. For this reason, it is difficult for the conventional phase comparator to perform a highly accurate phase comparison when the comparator performs a phase comparison between signals in the high-frequency band.

SUMMARY OF THE INVENTION

An object of the present invention is to provide a phase comparator solving the above-described problem and capable of performing a stable phase comparison for the high-frequency band.

A phase comparator according to the present invention that detects a phase difference between a first signal and a second signal serving as a reference includes a retiming circuit and a phase comparison unit. The retiming circuit samples the first signal at a timing synchronized with the second signal to output a third signal. The phase comparison unit passes a current according to the phase difference based on the first, second and third signals. The phase comparison unit includes first and second current sources, an output node and first and second current control circuits. The first current control circuit is connected between the first current source and the output node and passes a current flown to the output node when a result of an exclusive OR operation between the first signal and the third signal is a first logic level. The second current control circuit is connected between the second current source and the output node and receives a current flown from the output node when the second signal has a second logic level opposite to the first logic level. The first current control circuit has two switching units connected between the first current source and the output node. The two switching units are designed to provide the first logic level as the result of the exclusive OR operation between the first signal and the third signal when at-least one of the two switching units is turned on according to a predetermined combination of the first signal and the third signal that are input.

According to the present invention as discussed above, two switching units are provided in the first current control circuit which supplies a current to the output node when the result of the exclusive OR between the first signal and the third signal is the first logic level. The two switching units are configured to provide the first logic level as the result of the exclusive OR when at least one of the switching units is turned on according to a predetermined combination of the first and third signals. Accordingly, without logical operation of the exclusive OR by, for example, a logic circuit, the switching operation by the two switching units is associated with the logical operation to perform similar processing. Then, a fast phase-comparison operation can be carried out.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
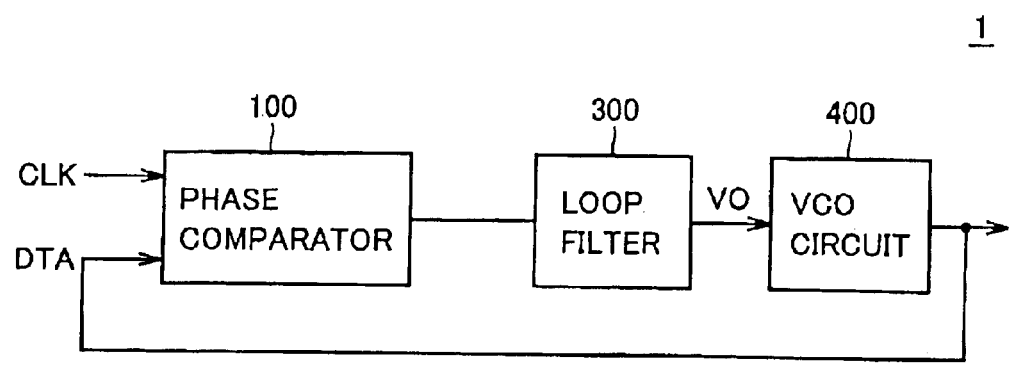
FIG. 1 is a schematic block diagram of a PLL circuit according to a first embodiment of the present invention.

Embodiments of the present invention are hereinafter described in detail with reference to the drawings. It is noted that the same components in the drawings are denoted by the same reference character and description thereof is not repeated here.

First Embodiment

Referring to FIG. 1, a PLL circuit 1 according to a first embodiment of the present invention includes a phase comparator 100, a loop filter 300 and a VCO circuit 400. Phase comparator 100 detects a phase difference between a clock signal CLK serving as a reference signal and a feedback signal DTA which is a feedback signal and, based on the phase difference, passes/receives a current to/from loop filter 300 or passes no current to loop filter 300. Loop filter 300 generates a control voltage VO according to a current flown in/out based on the phase difference detected by phase comparator 100. VCO circuit 400 generates a signal of a frequency based on control voltage VO generated by loop filter 300. The generated signal is feedback signal DTA to be fed back to phase comparator 100.

Figure 2:
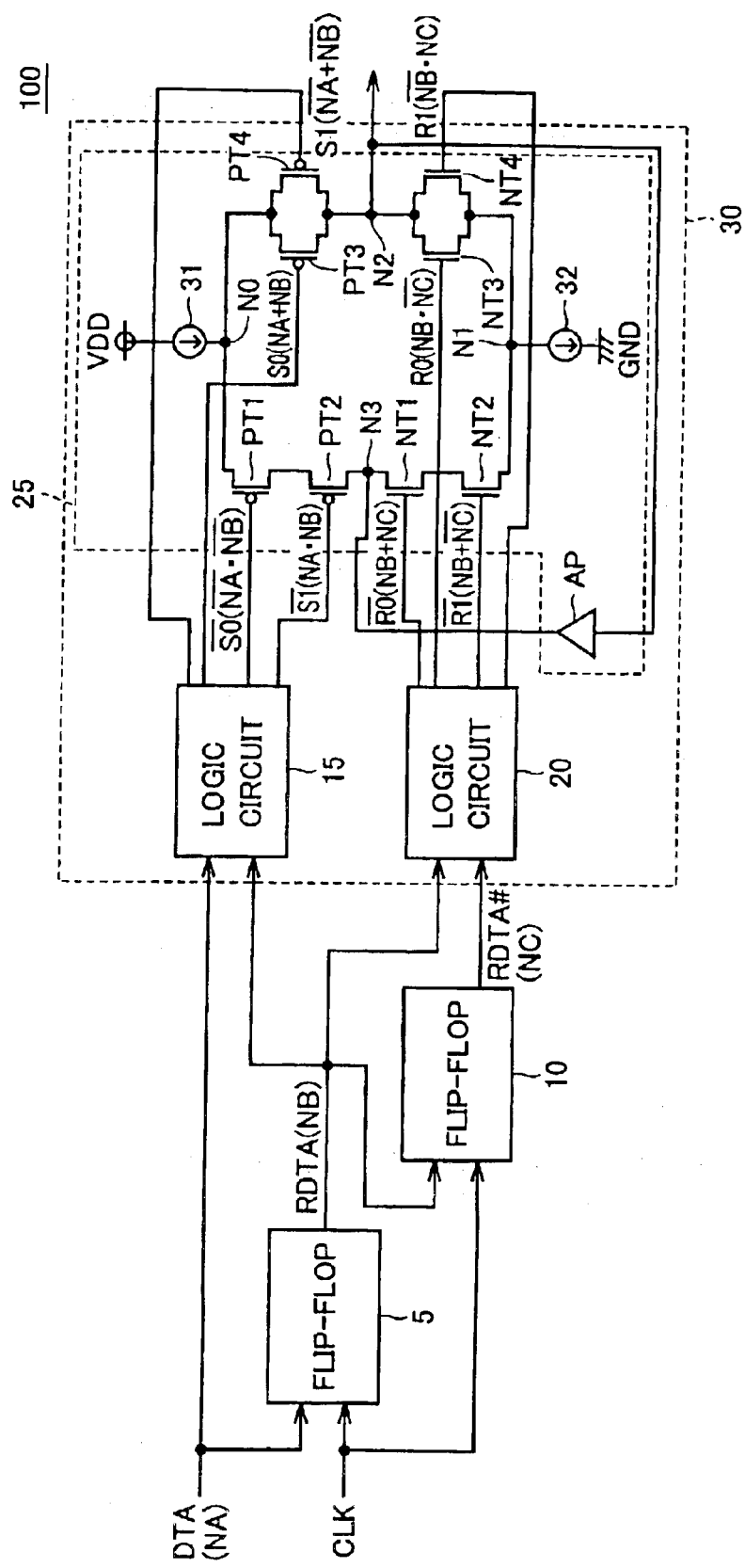
FIG. 2 is a circuit diagram showing a configuration of a phase comparator according to the first embodiment of the present invention.

Referring to FIG. 2, phase comparator 100 according to the first embodiment of the present invention includes a flip-flop circuit 5 (retiming circuit) sampling feedback signal DTA in synchronization with a rising edge of the clock signal, a flip-flop circuit 10 sampling signal RDTA in synchronization with a falling edge of the clock signal that is a half-period shifted from the rising edge, and a phase comparison unit 30 receiving/passing a current based on a phase comparison between signals obtained by sampling of flip-flop circuits 5 and 10.

Flip-flop circuit 5 generates a signal RDTA (NB) which is in phase with clock signal CLK by performing sampling in synchronization with the rising edge of clock signal CLK. Flip-flop circuit 10 generates a signal RDTA# (NC) having a phase difference corresponding to a half period of clock signal CLK relative to signal NB by performing sampling in synchronization with the falling edge of clock signal CLK. It is noted that signals DTA, RDTA and RDTA# are respectively referred to as signals NA, NB and NC in the following description. Further, the result of the exclusive OR between signal NA and signal NC corresponds to clock signal CLK.

Phase comparison unit 30 includes logic circuits 15 and 20 performing a predetermined logical operation on input signals and a current adjustment circuit 25 defining an amount of current to be received or passed from an output node.

Logic circuit 15 receives input signals NA and NB to output control signals S0 and S1 and respective inverted signals /S0 and /S1. Logic circuit 20 receives input signals NB and NC to output signals R0 and R1 and respective inverted signals /R0 and /R1. It is noted that symbol "/" herein represents inversion, negation or complementary, for example.

Current adjustment circuit 25 includes current sources 31 and 32, an amplifier AP, transistors PT1–PT4 and transistors NT1–NT4. Transistors PT1–PT4 are, for example, P-channel MOS transistors. Transistors NT1–NT4 are, for example, N-channel MOS transistors.

Current source 31 is placed between a power supply voltage VDD and a node N0. Transistors PT1 and PT2 are connected in series between nodes N0 and N3 and having respective gates receiving respective control signals /S0 and /S1 from logic circuit 15. Transistors PT3 and PT4 are connected in parallel between nodes N0 and N2 and having respective gates receiving respective control signals S0 and S1 from logic circuit 15. Transistors NT1 and NT2 are connected in series between nodes N3 and N1 and having respective gates receiving respective control signals /R0 and /R1 from logic circuit 20. Transistors NT3 and NT4 are connected in parallel between nodes N2 and N1 and having respective gates receiving respective control signals R0 and R1 from logic circuit 20. Current source 32 is placed between node N1 and a ground voltage GND. Amplifier AP amplifies a voltage level on node N2 to a predetermined level and outputs the amplified voltage to node N3.

An operation of phase comparison unit 30 is now described according to the first embodiment of the present invention.

Phase comparison unit 30 detects a phase difference between signal NA and signal NB relative to a phase difference between signal NB and signal NC. As discussed below, the phase difference between signal NB and signal NC corresponds to a half period of clock signal CLK. The phase difference between signal NA and signal NB is made equal to the phase difference between signal NB and signal NC to allow signal NA to be in phase with clock signal CLK. Accordingly, signal NA can be synchronized with clock signal CLK. Specifically, a phase difference between signal NA and signal NB is detected by a switching operation of a switching circuit formed of transistors PT3 and PT4 corresponding to the exclusive OR between signal NA and signal NB. Current source 31 passes a current based on the detected phase difference to node N2.

A phase difference between signal NB and signal NC is detected by a switching operation of a switching circuit formed of transistors NT3 and NT4 corresponding to the exclusive OR between signal NB and signal NC. Current source 32 receives a current based on the detected phase difference from node N2.

If the detected phase differences are equal to each other, a constant current flows from current source 31 to current source 32 and no current flows from node N2 to loop filter 300. On the other hand, if those phase differences differ from each other, a current is passed from node 2 to loop filter 300 or from loop filter 300 to node N2 according to the difference. As the phase difference between signal NB and signal NC corresponds to a half period of clock signal CLK and is thus constant, current source 32 receives the constant current from node N2. This phase comparison unit 30 detects a phase difference not by comparing a current which is once flown to the outside with a current thereafter flown in, but by performing a relative comparison between the constant reference current flown into current source 32 within the internal circuit and a current flown from current source 31. If an excess current relative to the constant current is flown from current source 31, the excess is flown from output node N2. If there is a shortage of the current, the shortage is compensated for by a current corresponding to the shortage that is flown from output node N2.

In other words, phase comparison unit 30 passes a current to or receives a current from loop filter 300 according to a difference between the constant current and an amount of current flown from current source 31 based on a phase difference between signal NA and signal NB. It is noted that, in this configuration of current adjustment circuit 25, the phase difference is chiefly detected by the switching circuitry on the right side while switching circuitry is also placed on the left side. Specifically, a switching circuit formed of transistors PT1 and PT2 is provided between node N3 and node N0 that operates complementarily to the switching circuit formed of transistors PT3 and PT4. Further, a switching circuit formed of transistors NT1 and NT2 is provided between node N3 and node N1 that operates complementarily to the switching circuit formed of transistors NT3 and NT4. These switching circuits are provided for ensuring the stability of operation of current adjustment circuit 25 as discussed hereinlater.

According to the first embodiment, the switching circuit provided between node N0 and node N2 is designed to be turned on, i.e., perform switching operation, to provide the result (L level) of the exclusive OR between signal NA and signal NB.

Specifically, the exclusive OR between signals NA and NB can be replaced with the AND operation between control signals S0 and S1. Control signal S0 corresponds to the result of the OR operation between signal NA and signal NB (NA+NB). Control signal S1 corresponds to the result of the OR operation between the inverted signal of signal NA and the inverted signal of signal NB ((/NA)+(/NB)). Control signals S0 and S1 are respectively input to respective gates of two P-channel MOS transistors PT3 and PT4 that are connected in parallel between node N0 and node N2 to constitute the switching circuit. The switching circuit can thus be designed to be turned to provide the result (L level) of the exclusive OR between signal NA and signal NB.

In this way, instead of a logic circuit performing the exclusive OR operation between signals NA and NB, the equivalent circuit can be configured by associating the logical operation with the on/off of the switching circuit to perform a faster switching operation.

It is noted that symbol "·" herein represents AND operation and symbol "+" herein represents OR operation.

Similarly, the switching circuit provided between node N2 and node N1 is designed to be turned on to provide the result (L level) of the exclusive OR between signal NB and signal NC.

Specifically, the exclusive OR between signal NB and signal NC can be replaced with the AND operation between control signals R0 and R1. Control signal R0 corresponds to the result of the AND operation between signal NB and the inverted signal of signal NC ((NB·(/NC)). Control signal R1 corresponds to the result of the AND operation between the inverted signal of signal NB and signal NC ((/NB)·NC). Control signals R0 and R1 are respectively input to respective gates of two N-channel MOS transistors NT3 and NT4 connected in parallel between node N1 and node N2 to constitute the switching circuit. The switching circuit can thus be designed to be turned on to provide the result (L level) of the exclusive OR between signal NA and signal NB. In this way, instead of a logic circuit performing the exclusive OR between signals NB and NC, the equivalent circuit can be configured by associating the logical operation with the on/off of the switching circuit to perform a faster switching operation.

Similarly, the switching circuit provided between node N0 and node N3 is designed to be turned on to provide the inverted signal (H level) of the result of the exclusive OR between signal NA and signal NB.

Specifically, the inverted signal of the result of the exclusive OR between signals NA and NB can be replaced with the result of the OR operation between the inverted signal of control signal S0 and the inverted signal of control signal S1. The inverted signals of respective control signals S0 and S1 are respectively input to respective gates of two P-channel MOS transistors PT1 and PT2 connected in series between node N0 and node N3 to constitute the switching circuit. The switching circuit can thus be designed to be turned on to provide the inverted signal (H level) of the result of the exclusive OR between signal NA and signal NB. In this way, instead of a logic circuit performing the exclusive OR between signal NA and signal NB to provide the inverted signal of the result, the equivalent circuit can be configured by associating the logical operation with the on/off of the switching circuit to perform a faster switching operation.

Similarly, the switching circuit provided between node N3 and node N1 is designed to be turned on to provide the inverted signal (H level) of the result of the exclusive OR between signal NB and signal NC.

Specifically, the inverted signal of the result of the exclusive OR between signal NB and signal NC can be replaced with the result of the AND operation between the inverted signal of control signal R0 and the inverted signal of control signal R1. The inverted signals of respective control signals R0 and R1 are respectively input to respective gates of two N-channel MOS transistors NT1 and NT2 connected in series between node N3 and node N1 to constitute the switching circuit. The switching circuit can thus be designed to be turned on to provide the inverted signal (H level) of the result of the exclusive OR between signal NB and signal NC. In this way, instead of a logic circuit performing the exclusive OR between signals NB and NC to provide the inverted signal of the result, the equivalent circuit can-be configured by associating the logical operation with the on/off of the switching circuit to perform a faster switching operation.

Figure 3:
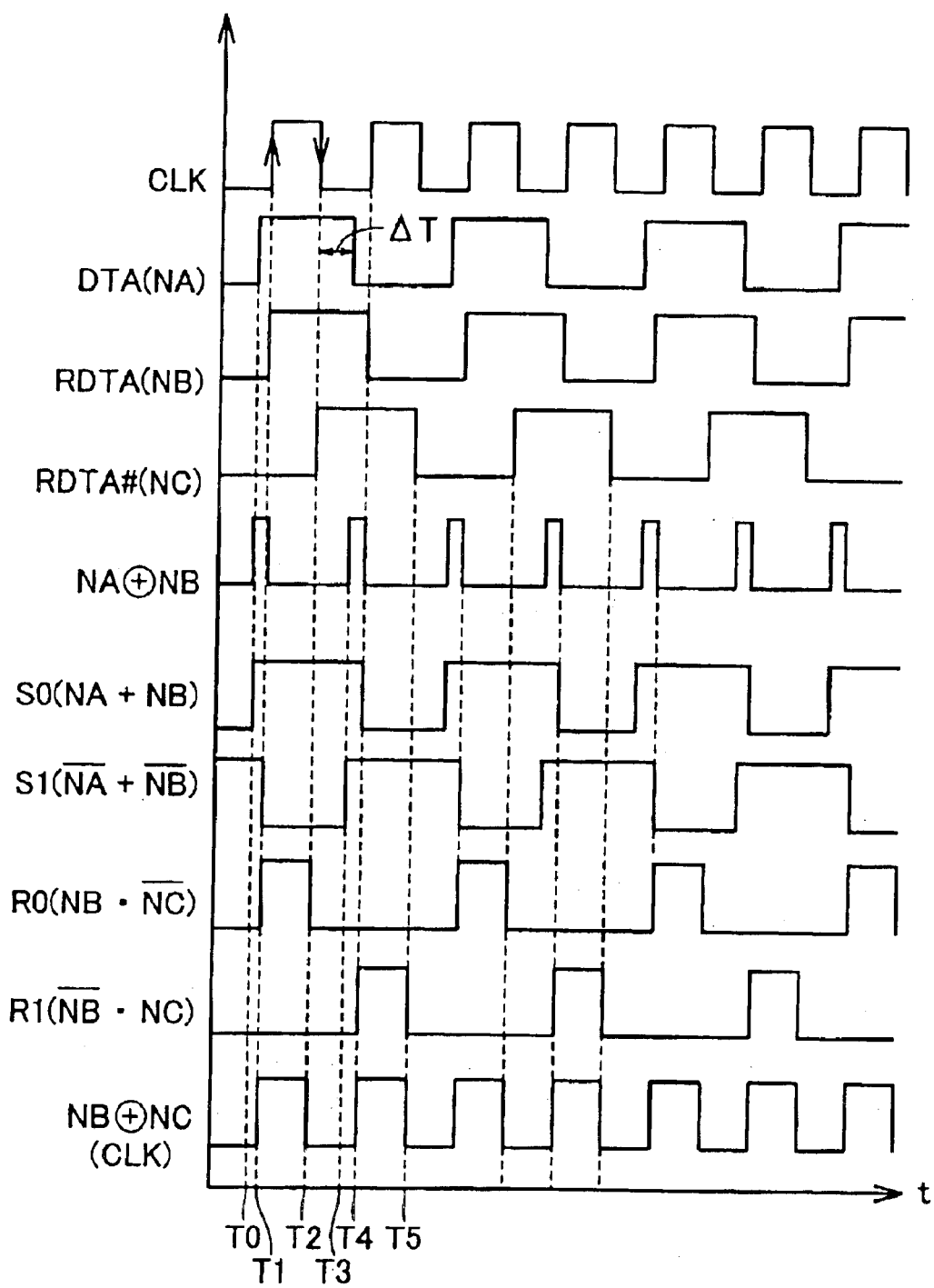
FIG. 3 is a timing chart illustrating an operation of a phase comparison unit.

An operation of phase comparison unit 30 in FIG. 2 is described now in conjunction with the timing chart in FIG. 3. The description here is based on the switching circuitry on the right side that performs the phase-difference detecting operation.

Referring to FIGS. 2 and 3, at time T1 and time T4 that are in synchronization with the rising edge of clock signal CLK, flip-flop circuit 5 outputs signal NB synchronized with the rising edge of clock signal CLK at which signal NA is sampled. At time T2 and time T5 that are in synchronization with the falling edge of clock signal CLK shifted by a half period from the rising edge, flip-flop circuit 10 outputs signal NC synchronized with the falling edge of clock signal CLK at which signal NB is sampled. In this example, signal NA is ΔT phase-delayed relative to signal NB. It is noted that, in this example, when a phase difference between signal NA and signal NB is equal to the half period of clock signal CLK, the phase of signal NA is regarded as being synchronized with the phase of clock signal CLK.

Phase comparison circuit 30 makes a relative phase comparison between signal NA and signal NB with reference to the phase difference between signal NB and signal NC. As shown in FIG. 3, it is supposed here that one period of clock signal CLK corresponding to the time from T1 to T4 is used as a reference. The result of the exclusive OR between signal NA and signal NB is provided as a signal set at L level in the period from time T1 to time T3 indicating that these signals are in phase in this period.

The phase difference between signal NB and signal NC corresponds to the half period of dock signal CLK. Then, the phase difference is represented by a signal which is the same as dock signal CLK. Namely, the signal representing the phase difference is set at H level in the period from time T1 to time T2 and at L level in the period from time T2 to time T4.

Current adjustment circuit 25 passes a current to loop filter 300 without flowing a current from current source 31 to current source 32 in the period from time T2 to time T3 corresponding to ΔT based on the phase difference between signal NA and signal NB.

Accordingly, phase comparison unit 30 performs the phase-difference detecting operation on the basis of the relative comparison to pass a current according to the phase difference.

If there is a large phase difference or a high-speed signal is input, the period in which the output signal representing the result of the exclusive OR between signal NA and signal NB is set at H or L level is short as shown in FIG. 3. In this case, it is difficult for the logic circuit to hold a sufficient period for charging/discharging of transistors in outputting the result of the exclusive OR. Further, there is an influence of the parasitic element such as the interconnection. Then, there is a possibility that an output signal representing the result of the exclusive OR having a correct logic level according to the phase difference could not be provided.

Specifically, if the period in which the output signal from the logic circuit that represents the result of the exclusive OR is set at H level is short, the level could be set at L level until the logic level rises to H level and consequently, the L level could be output all the time.

According to the first embodiment, in the detection of the phase difference, the switching operation of the transistors usually based on the output of the logic value (result of the exclusive OR between signal NA and signal NB) from the logic circuit is replaced with the sum (product) of currents in order to shorten the time necessary for charging/discharging of the transistors. For example, with reference to FIG. 2, the exclusive OR between signal NA and signal NB is replaced with the sum of currents output from P-channel MOS transistors PT3 and PT4. These two transistors are controlled by the signal as shown in FIG. 3 that has an appropriately sufficient length of the period of H or L level. Therefore, the sum of currents correctly reflects the phase difference. In other words, a stable phase-difference detecting operation can be carried out by using this configuration.

Figure 4:
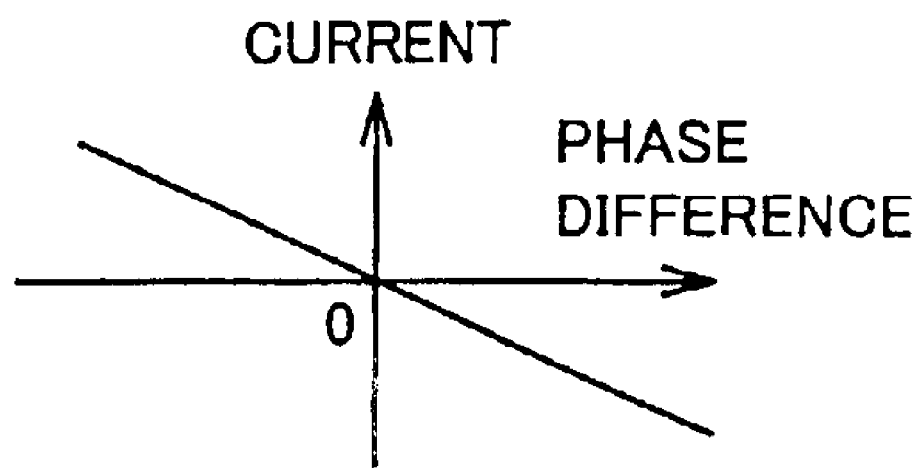
FIG. 4 shows a relation between an amount of current flown from an output node of a current adjustment circuit to a loop filter and the phase difference.

The amount of current flown from output node N2 of current adjustment circuit 25 to loop filter 300 has a relation with the phase difference as described below in connection with FIG. 4.

The current is flown to or from loop filter 300 according to the phase difference between signal NA and signal NB relative to the phase difference between signal NB and signal NC.

In the example shown in FIG. 3, the phase of signal NA is delayed by period ΔT. It is supposed here that the phase difference between signal NA and signal NB relative to the phase difference between signal NB and signal NC has a negative value. Accordingly, the switching circuit formed of P-channel MOS transistors PT3 and PT4 is in the ON state or performs the switching operation for a longer period of time than the switching circuit formed of N-channel MOS transistors NT3 and NT4 and thus a current is flown into loop filter 300.

Figure 5:
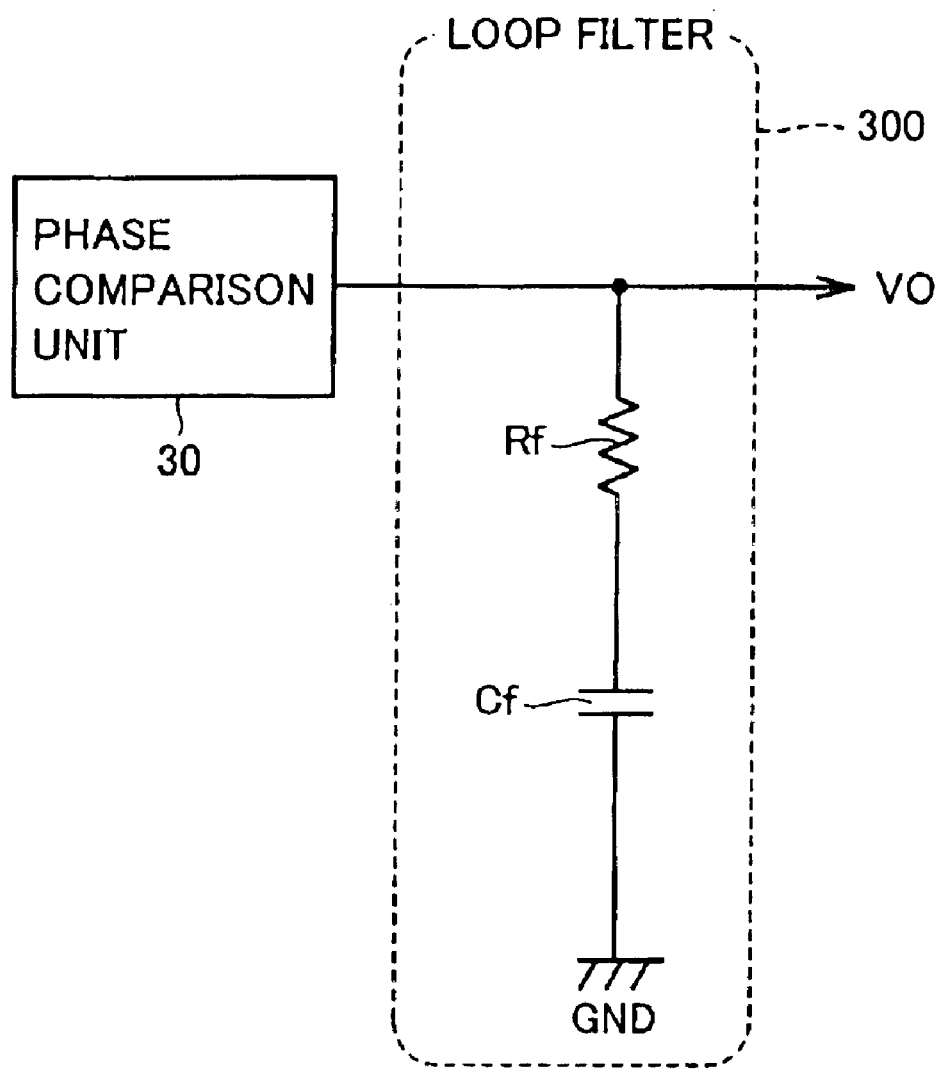
FIG. 5 is a circuit diagram showing a configuration of the loop filter.

Referring to FIG. 5, loop filter 300 includes a resistor Rf and a capacitor Cf connected in series between output node N2 of phase comparison unit 30 and ground voltage GND.

The current flown in/flown out of loop filter 300 is integrated by resistor Rf and capacitor Cf to be converted into a voltage of substantially direct current that is control voltage VO.

Figure 6:
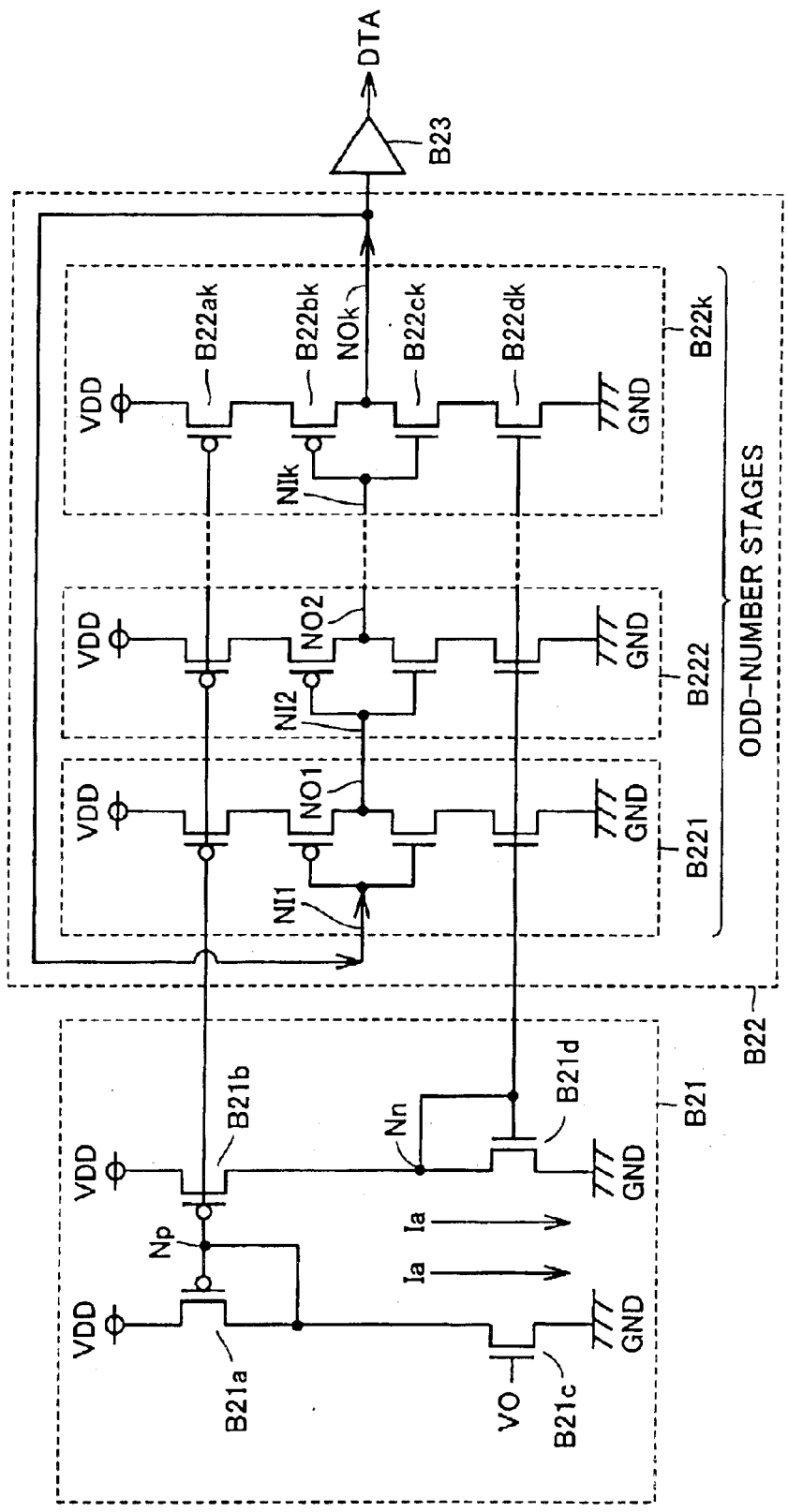
FIG. 6 is a circuit diagram showing a configuration of a VCO circuit.

Referring to FIG. 6, VCO circuit 400 shown in FIG. 1 includes a voltage adjustment circuit B21 generating a voltage based on control voltage VO on a node Np and a node Nn, an oscillator B22 generating its output at a frequency according to the voltage generated on nodes Np and Nn and a buffer circuit B23 receiving the output from oscillator B22 to output feedback signal DTA.

Voltage adjustment circuit B21 includes transistors B21a–B21d. Transistor B21c is placed between node Np and ground voltage GND and having its gate receiving control voltage VO. Transistor B21a is placed between power supply voltage VDD and node Np and having its gate connected to node Np. Transistor B21b is placed between node Nn and power supply voltage VDD and having its gate connected to node Np. Transistor B21d is placed between node Nn and ground voltage GND and having its gate connected to node Nn. Transistors B21a and B21b constitute a current mirror circuit. Then, if transistors B21a and B21b have the same size, the same passing current Ia according to control voltage VO flows through transistors B21a and B21b.

Oscillator B22 includes a plurality of inverters B221-B22k respectively connected in series that are respectively in an odd number of stages. An output of inverter B22k is fed back to an input of inverter B221.

Further, the output of inverter B22k is connected to an input of buffer circuit B23.

Inverter B22k is capable of controlling the delay time and includes a P-channel transistor B22ak having its gate connected to node Np and controlling a current from the power supply node to which power supply voltage VDD is applied, an N-channel transistor B22dk having its gate connected to node Nn and limiting a current flowing to the ground node, and a P-channel transistor B22bk and an N-channel transistor B22ck connected in series between the drain of P-channel transistor B22ak and the drain of N-channel transistor B22dk.

Respective gates of P-channel transistor B22bk and N-channel transistor B22ck are connected to each other to serve as an input node of inverter B22k, and the drain of P-channel transistor B22bk serves as an output node of inverter B22k.

The gate of transistor B22ak is connected to node Np and, similarly to transistor B21b, constitutes a current mirror circuit together with transistor B21a. The gate of transistor B22dk is connected to node Nn and, together with transistor B21d, constitutes a current mirror circuit. Therefore, a current according to passing current Ia flowing through transistor B21d flows through transistor B22dk. It is noted that, when transistors B21d and B22dk have the same size, the same passing current Ia flows through the transistors.

Other inverters have the same configuration as that described above. The operating speed of the inverters is adjusted based on passing current Ia flowing through voltage adjustment circuit B21 to adjust the frequency of the output from the oscillator.

For example, if a current is flown from phase comparator 100 into loop filter 300, control voltage VO generated by loop filter 300 increases. Accordingly, in VCO circuit 400, voltage adjustment circuit B21 increases the amount of passing current Ia according to the increase of control-voltage VO. The inverters then operate at a higher speed. Therefore, the oscillator output at a resultant frequency has its phase advanced accordingly. In this example, although the configuration described here exemplarily uses the so-called ring VCO circuit, the configuration may use an LC type VCO circuit which utilizes LC oscillations by variable capacitances and inductances.

Referring again to FIG. 2, the switching circuit constituted of transistors PT1 and PT2, the switching circuit constituted of transistors NT1 and NT2 and amplifier Ap are described. These circuits are provided for ensuring the stability of operation of current adjustment circuit 25.

Specifically, the potential on node N1 connected to current source 32 is maintained at a predetermined level or higher. As described above, the switching circuit constituted of N-channel MOS transistors NT3 and NT4 is in the ON state for one half of one period of clock signal CLK and in the OFF state for the other half of the period of clock signal CLK. Therefore, the potential on node N1 decreases to a level close to ground voltage GND in the OFF period of the switching circuit and then current source 32 could not function as a current source. Accordingly, the switching circuit constituted of N-channel MOS transistors NT1 and NT2 that operates complementarily is provided to amplify the voltage level on node, N2 by amplifier AP and provide a current path from node N3 to node N1 (current supply unit). In this way, a current to a degree is constantly flown to current source 32. It never occurs that the potential on node N1 frequently decreases. Then, current source 32 stably functions as a current source. Similarly, a current to a degree is constantly flown from node N0 to node N3 since amplifier AP serves to maintain the voltage level on node N0 at a certain voltage level or higher. Current source 31 can thus function as a stable current source since amplifier AP restricts variation of the potential level on node N0.

Second Embodiment

In the first embodiment described above, the exclusive OR between signals NA and NB is implemented by the switching circuit in current adjustment circuit 25.

According to a second embodiment, a configuration is described that uses a switching circuit implementing the exclusive OR between signal NA and signal NB according to another combination of logic signals.

The exclusive OR between signal NA and signal NB can be transformed into the following expression:

$$NA \oplus NB = NA \cdot \overline{NB} + \overline{NA} \cdot NB = (\overline{NA} + NB) + (NA + \overline{NB})$$

$$= (NA + NB) \cdot (\overline{NA} + \overline{NB}) = \overline{(\overline{NA \cdot NB})} \cdot \overline{(NA \cdot NB)}$$

where symbol "⊕" herein represents the exclusive OR.

Figure 7:
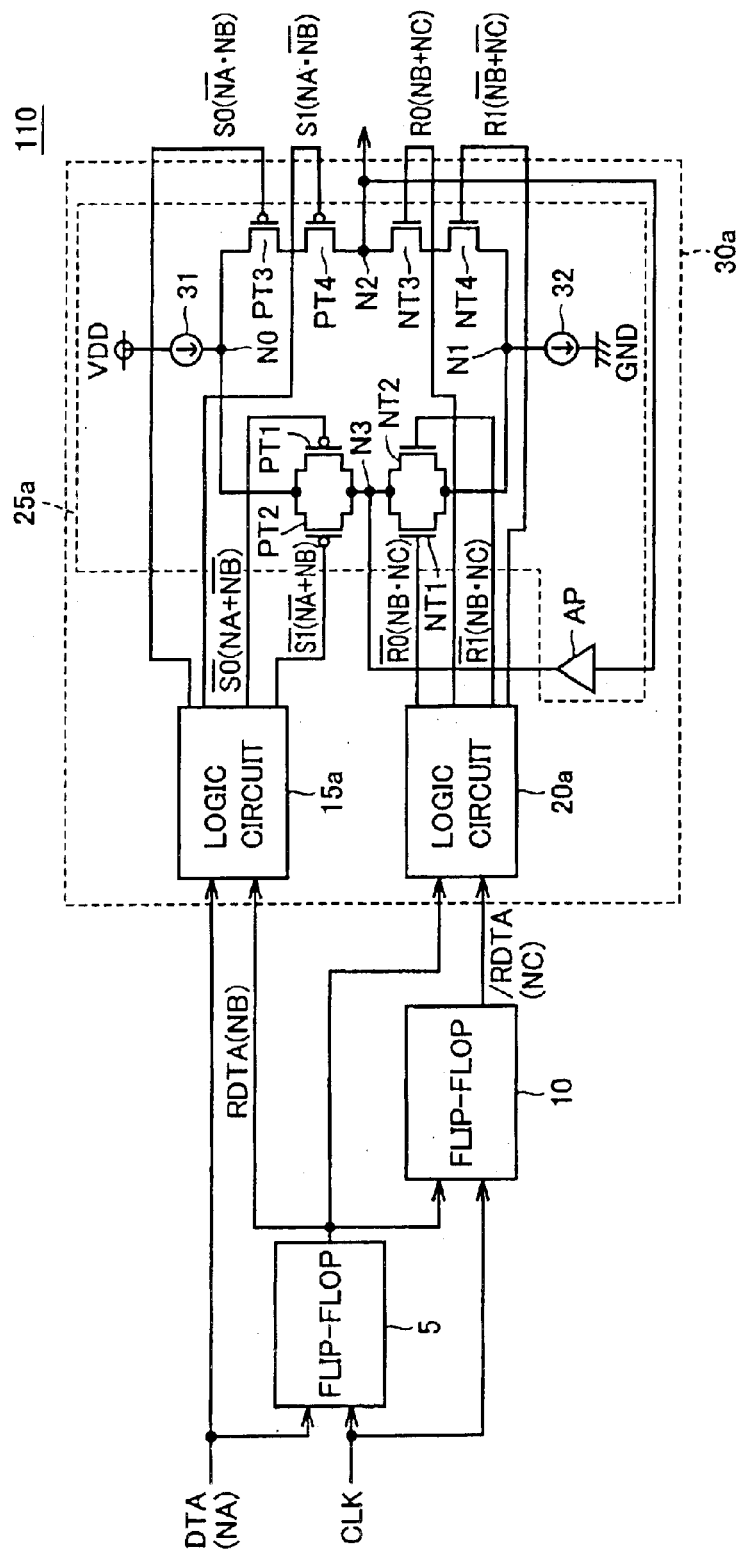
FIG. 7 is a circuit diagram showing a configuration of a phase comparator according to a second embodiment.

Referring to FIG. 7, a phase comparator 110 according to the second embodiment differs from phase comparator 100 in that a phase comparison unit 30$a$ is used instead of phase comparison unit 30.

Phase comparison unit 30$a$ differs from phase comparison unit 30 in that logic circuits 15$a$ and 20$a$ are used instead of logic circuits 15 and 20 respectively and a current adjustment circuit 25$a$ is used instead of current adjustment circuit 25.

Logic circuit 15$a$ generates control signals S0 (/NA·NB) and S1 (NA·(/NB)) and respective inverted control signals /S0 and /S1.

Logic circuit 20$a$ generates control signals R0 (NB+NC) and R1 ((/NB)+(/NC)) and respective inverted control signals /R0 and /R1.

In current adjustment circuit 25$a$, P-channel MOS transistors PT1 and PT2 are connected in parallel and receive input control signals /S0 and /S1 respectively. P-channel MOS transistors PT3 and PT4 are connected in series and receive input control signals S0 and S1 respectively. N-channel MOS transistors NT1 and NT2 are connected in parallel and receive input control signals /R0 and /R1 respectively. N-channel MOS transistors NT3 and NT4 are connected in series and receive input control signals R0 and R1 respectively.

With this configuration, a switching circuit formed of P-channel MOS transistors PT3 and PT4 is designed to be turned on in response to the result (L level) of the exclusive OR between signal NA and signal NB. A switching circuit formed of P-channel MOS transistors PT1 and PT2 is designed to be turned on in response to the result (H level) of the exclusive OR between signal NA and signal NB. A switching circuit formed of N-channel MOS transistors NT3 and NT4 is designed to be turned on in response to the result (L level) of the exclusive OR between signal NB and signal NC. A switching circuit formed of N-channel MOS transistors NT1 and NT2 is designed to be turned on in response to the result (H level) of the exclusive OR between signal NB and signal NC.

In other words, the switching operation of the transistors usually based on the output of the logic value (exclusive OR between signal NA and signal NB) from the logic circuit is replaced with the sum product) of currents in order to shorten the time necessary for charging/discharging of the transistors.

Thus, the exclusive OR between signal NA and signal NB can be implemented by the switching circuit using control signals S0 and S1 as done in the first embodiment by adjustment of a predetermined logic combination and transistors constituting the switching circuit.

According to the second embodiment, a phase comparison can be made efficiently with high precision by selecting the best logic combination and applying it to the phase comparator in consideration of layout constraints and the output waveform of the logic circuit.

Third Embodiment

According to a third embodiment of the present invention, description is given of a configuration of a phase comparator for performing a faster phase comparing operation relative to the first embodiment.

Figure 8:
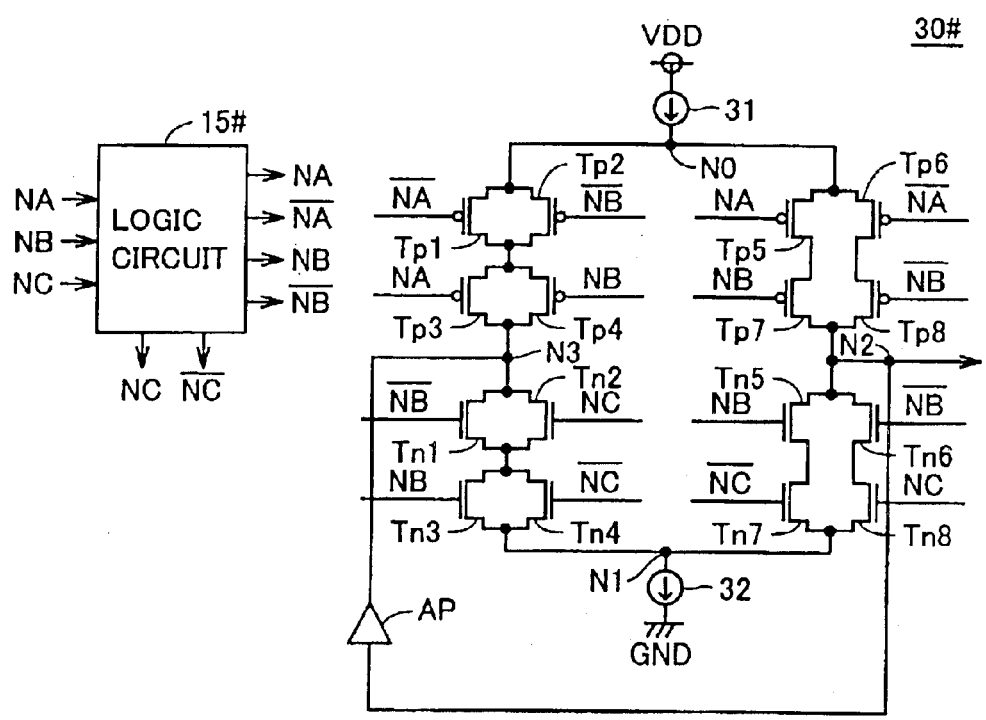
FIG. 8 is a circuit diagram showing a configuration of a phase comparison unit according to a third embodiment.

Referring to FIG. 8, a phase comparison unit 30# according to this embodiment includes a logic circuit 15#, transistors Tp1–Tp8, current sources 31 and 32 and transistors Tn1–Tn8.

Logic circuit 15# receives input signals NA, NB and NC to directly output signals NA, NB and NC and output respective inverted signals /NA, /NB and /NC.

Current source 31 is placed between a power supply voltage VDD and a node N0. Current source 32 is placed between a node N1 and a ground voltage GND.

Transistors Tp1, Tp2 and transistors Tp3, Tp4 are connected in series between nodes N0 and N3. Transistors Tp1 and Tp2 are connected in parallel with each other and having respective gates receiving input signals /NA and /NB. Transistors Tp3 and Tp4 are connected in parallel with each other and having respective gates receiving input signals NA and NB. Transistors Tp5, Tp7 and transistors Tp6, Tp8 are connected in parallel between nodes N0 and N2. Transistors Tp5 and Tp7 are connected in series and having respective gates receiving input signals NA and NB. Transistors Tp6 and Tp8 are connected in series and having respective gates receiving input signals /NA and /NB.

Transistors Tn1, Tn2 and transistors Tn3, Tn4 are connected in series between nodes N3 and N1. 1Transistors Tn1 and Tn2 are connected in parallel with each other and having respective gates receiving input signals /NB and NC. Transistors Tn3 and Tn4 are connected in parallel with each other and having respective gates receiving input signals NB and /NC. Transistors Tn5, Tn7 and transistors Tn6, Tn8 are connected in parallel between nodes N2 and N1. Transistors Tn5 and Tn7 are connected in series and having respective gates receiving input signals NB and /NC. Transistors Tn6 and Tn8 are connected in series and having respective gates receiving input signals /NB and NC.

Phase comparison unit 30# shown in FIG. 8 is an equivalent circuit to phase comparison unit 30 described in connection with FIG. 2.

Specifically, transistors Tp5 and Tp7 connected in series and having respective gates receiving signals NA and NB are equivalent to transistor PT3 receiving control signal S0. Similarly, transistors Tp6 and Tp8 connected in series and having respective gates receiving respective inverted signals of signals NA and NB are equivalent to transistor PT4 having its gate receiving control signal S1. Transistors Tn5 and Tn7 connected in series and having respective gates receiving signal NB and the inverted signal of signal NC are equivalent to transistor NT3 having its gate receiving control signal R0. Similarly, transistors Tn6 and Tn8 connected in series and having respective gates receiving the inverted signal of signal NB and signal NC are equivalent to transistor NT4 having its gate receiving control signal R1.

Further, in the complementarily operating switching circuit as well, transistors Tp3 and Tp4 connected in parallel and having respective gates receiving signals NA and NB are equivalent to transistor PT2 having its gate receiving the inverted signal of control signal S1. Similarly, transistors Tp1 and Tp2 connected in parallel and having respective gates receiving the inverted signal of signal NA and the inverted signal of signal NB are equivalent to transistor PT1 having its gate receiving the inverted signal of control signal S0. Transistors Tn1 and Tn2 connected in parallel and having respective gates receiving the inverted signal of signal NB and signal NC are equivalent to transistor NT1 having its gate receiving the inverted signal of control signal R0. Similarly, transistors Tn3 and Tn4 connected in parallel and having respective gates receiving signal NB and the inverted signal of signal NC are equivalent to transistor NT2 having its gate receiving the inverted signal of control signal R1.

Thus, instead of performing the exclusive OR between signal NA and signal NB by the logic circuit, the configuration of the equivalent circuitry associated with on/off of the switching circuit formed of four transistors can be used to achieve a faster switching operation. Moreover, as the switching operation is performed with only signals NA, /NA, NB and /NB, a sufficient charging/discharging period of the transistors of the logic circuit that provide the output signal of the result of the exclusive OR can be secured. A further stable and faster switching operation can thus be performed. Moreover, the simplified circuit configuration of logic circuit 15# reduces the number of components. Further, the number of gates can be reduced to save power.

Fourth Embodiment

According to a fourth embodiment, description is given of a configuration of a phase comparator performing a faster phase comparing operation relative to the second embodiment.

Figure 9:
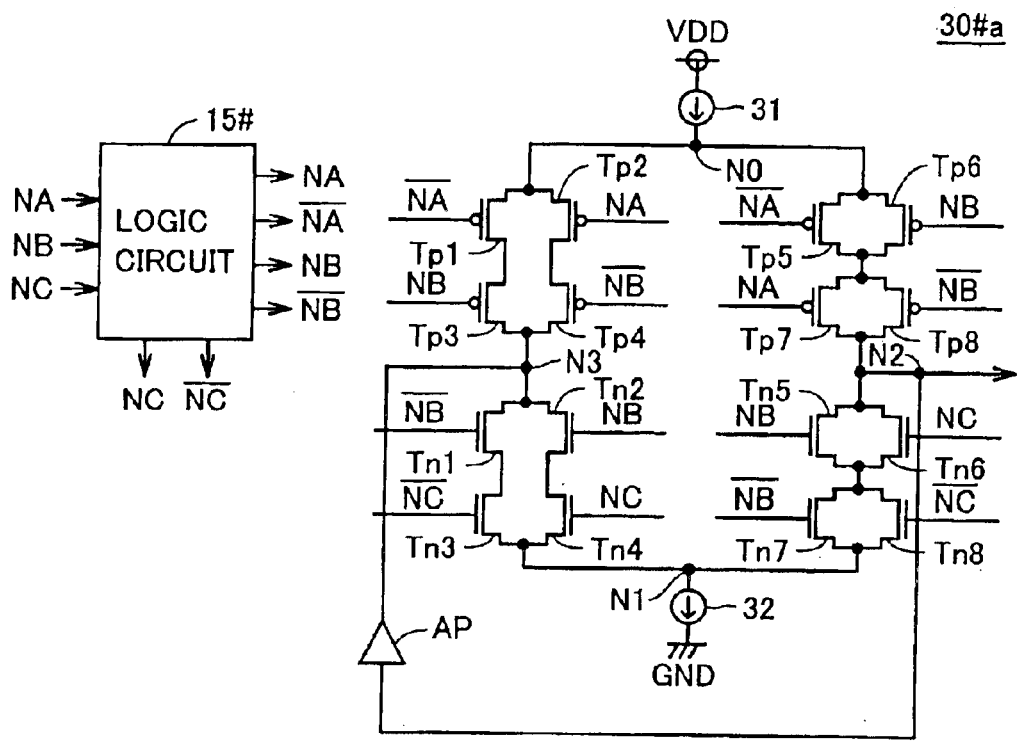
FIG. 9 is a circuit diagram showing a configuration of a phase comparison unit according to a fourth embodiment.

Referring FIG. 9, a phase comparison unit 30#a according to the fourth embodiment includes a logic circuit 15#, P-channel MOS transistors Tp1–Tp8, current sources 31 and 32 and N-channel MOS transistors Tn1–Tn8. It is noted that, in this example, the components of phase comparison unit 30#a are denoted by the same reference characters respectively as those in phase comparison unit 30# for the purpose of simplicity.

Logic circuit 15# receives input signals NA, NB and NC and directly output signals NA, NB and NC and respective inverted signals /NA, /NB and /NC.

Current source 31 is placed between power supply voltage VDD and node N0. Current source 32 is placed between node N1 and ground voltage GND.

Transistors Tp1, Tp3 and transistors Tp2, Tp4 are connected in parallel between nodes N0 and N3. Transistors Tp1 and Tp3 are connected in series and having respective gates receiving input signals /NA and NB. Transistors Tp2 and Tp4 are-connected in series and having respective gates receiving input signals NA and /NB. Transistors Tp5, Tp6 and transistors Tp7, Tp8 are connected in series between nodes N0 and N2. Transistors Tp5 and Tp6 are connected in parallel and having respective gates receiving signals /NA and NB. Transistors Tp7 and Tp8 are connected in parallel and having respective gates receiving input signals NA and /NB.

Transistors Tn1, Tn3 and transistors Tn2, Tn4 are connected in parallel between nodes N3 and N1. Transistors Tn1 and Tn3 are connected in series and having respective gates receiving signals NB and /NC. Transistors Tn2 and Tn4 are connected in series and having respective gates receiving input signals NB and NC. Transistors Tn5, Tn6 and transistors Tn7, Tn8 are connected in series between nodes N2 and N1. Transistors Tn5 and Tn6 are connected in parallel and having respective gates receiving input signals NB and NC. Transistors Tn7 and Tn8 are connected in parallel and having respective gates receiving input signals /NB and /NC.

Phase comparison unit 30#a shown in FIG. 9 is equivalent to phase comparison unit 30a described in connection with FIG. 7.

Specifically, transistors Tp5 and Tp6 connected in parallel and having respective gates receiving signals /NA and NB are equivalent to transistor PT3 having its gate receiving control signal S0. Similarly, transistors Tp7 and Tp8 connected in parallel and having respective gates receiving signals NA and /NB are equivalent to transistor PT4 having its gate receiving control signal S1. Transistors Tn5 and Tn6 connected in parallel and having respective gates receiving signals NB and NC are equivalent to transistor NT3 having its gate receiving control signal R0. Similarly, transistors Tn7 and Tn8 connected in parallel and having respective gates receiving signals /NB and /NC are equivalent to transistor NT4 having its gate receiving control signal R1.

Similarly, in the complementarily operating switching circuit, transistors Tp1 and Tp3 connected in series and having respective gates receiving signals /NA and NB are equivalent to transistor PT2 having its gate receiving control signal /S1. Transistors Tp2 and Tp4 connected in series and having respective gates receiving signals NA and /NB are equivalent to transistor PT1 having its gate receiving control signal /S0. Transistors Tn1 and Tn3 connected in series and having respective gates receiving signals /NB and /NC are equivalent to transistor NT1 having its gate receiving control signal /R0. Similarly, transistors Tn2 and Tn4 connected in series and having respective gates receiving signals NB and NC are equivalent to transistor NT2 having its gate receiving inverted control signal /R1.

As described above, similarly to the configuration of the third embodiment, instead of the exclusive OR between signals NA and NB performed by the logic circuit, the equivalent configuration of the circuit associated with on/off of the switching circuit formed of four transistors can be used to achieve a faster switching operation.

The above configuration thus provides the same effect as that of the third embodiment.

The PLL circuit is used in this description of the phase comparator in the PLL circuit. The phase comparator of the present invention, however, is not limited to the above-discussed one and may be any of other circuits such as a DLL (delay-locked loop) circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase comparator for detecting a phase difference between a first signal and a second signal serving as a reference, comprising:

a retiming circuit sampling said first signal at a timing synchronized with said second signal to output a third signal; and a phase comparison unit for passing a current according to the phase difference based on said first, second and third signals, said phase comparison unit including a first current source and a second current source, an output node, a first current control circuit connected between said first current source and said output node and passing a current flown to said output node when a result of an exclusive OR operation between said first signal and said third signal is a first logic level, and a second current control circuit connected between said second current source and said output node and receiving a current flown from said output node when said second signal has a second logic level opposite to said first logic level, said first current control circuit having two switching units connected between said first current source and said output node, and said two switching units being designed to provide said first logic level as the result of the exclusive OR operation between said first signal and said third signal when at least one of said two switching units is turned on according to a predetermined combination of said first signal and said third signal that are input.

2. The phase comparator according to claim 1, wherein said phase comparison unit further includes a first logic circuit provided correspondingly to one of said two switching units and receiving respective inputs of said first signal and said third signal to output a result of a logical OR operation between said first signal and said third signal, and a second logic circuit provided correspondingly to the other of said two switching units and receiving respective inputs of said first signal and said third signal to output a result of a logical OR operation between an inverted signal of said first signal and an inverted signal of said third signal.

3. The phase comparator according to claim 1, wherein said phase comparison unit further includes a first logic circuit provided correspondingly to one of said two switching units and receiving respective inputs of said first-signal and said third signal to output a result of a logical AND operation between an inverted signal of said first signal and said third signal, and a second logic circuit provided correspondingly to the other of said two switching units and receiving respective inputs of said first signal and said third signal to output a result of a logical AND operation between said first signal and an inverted signal of said third signal.

4. The phase comparator according to claim 1, wherein said two switching units are connected in parallel between said first current source and said output node, one of said two switching units has first and second switching elements connected in series, said first and second switching elements are turned on when both of respective inputs of said first signal and said third signal have said first logic level, the other of said two switching units has third and fourth switching elements connected in series, and said third and fourth switching elements are turned on when both of respective inputs of an inverted signal of said first signal and an inverted signal of said third signal have said first logic level.

5. The phase comparator according to claim 1, wherein said two switching units are connected in series between said first current source and said output node, one of said two switching units has first and second switching elements connected in parallel, at least one of said first and second switching elements is turned on when at least one of respective inputs of said first signal and an inverted signal of said third signal has said first logic level, the other of said two switching units has third and fourth switching elements connected in parallel, and at least one of said third and fourth switching elements is turned on when at least one of respective inputs of an inverted signal of said first signal and said third signal has said first logic level.

6. The phase comparator according to claim 1, wherein said phase comparison unit further includes an internal node connecting said second current source and said second current control circuit, and a current supply unit supplying a current from said output node to said internal node when said second signal has said first logic level.

7. The phase comparator according to claim 1, wherein said phase comparison unit passes a current flown to said output node, according to a relative comparison between a first period serving as a reference and a second period, said first period is a period in which said second signal has said second logic level and said second period is a period in which the result of the exclusive OR operation between said first signal and said third signal in said first current control circuit is said first logic level, when said second period is longer than said first period, the current is flown out from said output node according to said relative comparison, when said first period is longer than said second period, the current is flown in from said output node according to said relative comparison and, when said first period is equal to said second period, a predetermined current is passed from said first current control circuit to said second current control circuit via said output node.

* * * * *